(12) United States Patent
Lamey et al.

(10) Patent No.: US 8,212,321 B2
(45) Date of Patent: Jul. 3, 2012

(54) SEMICONDUCTOR DEVICE WITH FEEDBACK CONTROL

(75) Inventors: Daniel J. Lamey, Phoenix, AZ (US); Michael Guyonnet, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 438 days.

(21) Appl. No.: 12/609,763

(22) Filed: Oct. 30, 2009

(65) Prior Publication Data

US 2011/0102077 A1     May 5, 2011

(51) Int. Cl.
  *H01L 27/11* (2006.01)
(52) U.S. Cl. .................. 257/379; 257/531; 327/594
(58) Field of Classification Search .................. 257/379, 257/341, 343, 528, 531; 327/594
  See application file for complete search history.

(56) References Cited

U.S. PATENT DOCUMENTS

| | | | |
|---|---|---|---|
| 6,222,229 | B1 | 4/2001 | Hebert et al. |
| 6,521,923 | B1 | 2/2003 | D'Anna et al. |
| 6,744,117 | B2 | 6/2004 | Dragon et al. |
| 7,061,057 | B2 | 6/2006 | Babcock et al. |
| 7,119,415 | B2 | 10/2006 | Norstrom et al. |
| 7,148,540 | B2 | 12/2006 | Shibib et al. |
| 7,221,034 | B2 | 5/2007 | Ma et al. |
| 7,253,492 | B2 | 8/2007 | Ma et al. |
| 2002/0033508 | A1 | 3/2002 | Morikawa et al. |
| 2003/0218209 | A1 | 11/2003 | D'Anna et al. |
| 2004/0089897 | A1 | 5/2004 | Johansson et al. |
| 2004/0238871 | A1 | 12/2004 | Herzum et al. |
| 2005/0087834 | A1 | 4/2005 | Norstrom et al. |
| 2005/0189588 | A1 | 9/2005 | Ma et al. |
| 2005/0280080 | A1 | 12/2005 | Babcock et al. |
| 2005/0280085 | A1 | 12/2005 | Babcock et al. |
| 2005/0280087 | A1 | 12/2005 | Babcock et al. |
| 2007/0020863 | A1 | 1/2007 | Ma et al. |
| 2011/0102077 | A1* | 5/2011 | Lamey et al. ................. 327/594 |

FOREIGN PATENT DOCUMENTS

WO      2005022645 A2    3/2005

* cited by examiner

*Primary Examiner* — Mark Prenty
(74) *Attorney, Agent, or Firm* — Ingrassia Fisher & Lorenz, PC (57) ABSTRACT

An electronic element (39', 39, 40) having feedback control is provided by placing an inductive interposer (42) between the output connection or bus (382) and the input connection or bus (381), wherein the inductive interposer (42) forms part of a closed circuit (47) with the inductive interposer (42) substantially parallel with the output connection or bus (382) and input connection or bus (381) for a distance permitting significant inductive coupling therebetween. In a preferred embodiment, the closed circuit (47) containing the inductive interposer (42) comprises impedance $Z_T$. By including various circuit elements (e.g., resistance, capacitance, and/or inductance) in $Z_T$, the output-to-input feedback can be modified to advantage. This greatly increases the available design freedom, especially for power devices, such as for example, field effect, MOSFET, LDMOS, bipolar and other power devices that use substantially parallel input and output bus structures.

20 Claims, 7 Drawing Sheets

SEMICONDUCTOR DEVICE WITH FEEDBACK CONTROL

FIELD OF THE INVENTION

The present invention generally relates to semiconductor (SC) devices and integrated circuits (ICs) and, more particularly, structures and methods for controlling output-to-input feedback in power devices and ICs.

BACKGROUND OF THE INVENTION

It is well known in electronic device, especially with transistors having very closely spaced electrodes, that feedback from the output electrodes to the input electrodes can adversely affect the overall device and or circuit behavior. In general, the severity of the problem increases with increasing frequency of operation because small parasitic elements, such as for example stray capacitance and mutual inductance, can have a greater effect as frequency increases. The effect of such stray capacitance with integrated circuits (ICs) and high frequency devices has been extensively studied and it is well known to attempt to ameliorate such adverse feedback by inserting a grounded metal shield between input and output conductors to limit the electric field coupling between input and output. However, such prior art electric field containment approaches do not deal with all of the feedback effects that can afflict high frequency power devices. Accordingly, an ongoing need continues to exist for structures and methods for further reducing and/or controlling feedback effects in high frequency power devices, especially inductive coupling effects.

BRIEF DESCRIPTION OF THE DRAWINGS

The present invention will hereinafter be described in conjunction with the following drawing figures, wherein like numerals denote like or analogous elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner. As used herein the terms "inductive coupling," "inductively coupled" and the like are intended to refer to coupling effects that occur primarily via magnetic fields.

As used herein, the term "semiconductor" is intended to include any semiconductor whether single crystal, polycrystalline or amorphous and include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, semiconductor-on-insulator (SOI) structures, and combinations thereof. The term "semiconductor" is abbreviated as "SC."

For convenience of explanation and not intended to be limiting, the semiconductor devices and methods of fabrication are described herein for silicon semiconductors but persons of skill in the art will understand that other semiconductor materials can also be used. Further, even though the present invention is illustrated for the case of power MOSFETS, those of skill in the art will understand that the present invention applies to any type of device utilizing elongated conductors feeding the input and output regions of the device. Non limiting examples are bipolar devices and various other types of field effect devices and composite devices. As used herein the term "metal" is intended to include semi-metals, semiconductor-metal alloys and other materials that are relatively more conductive than the associated semiconductor body or regions. The term "oxide" as for example in metal-oxide-semiconductor (MOS) and the like is intended to include any type of insulating dielectric whether or not it contains oxygen. Further, the convention is adopted in connection with field effect devices such as those described herein to use the word "length" for the gate dimension parallel to the source-drain spacing and the word "width" for the gate dimension perpendicular to the source-drain spacing. In the context of the device of FIGS. 1-3 and 6-7, it is the gate "width" that is substantially parallel to the drain length, that is, the long dimension of the drain.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conduction type may be provided by interchanging conductivity types so that a P-type region becomes an N-type region and vice versa. Alternatively, the particular regions illustrated in what follows may be more generally referred to as of a "first conductivity type" and a "second, opposite conductivity type", where the first conductivity type may be either N or P type and the second opposite conductivity type is then either P or N type, and so forth. Further, while the embodiments of the invention are illustrated primarily for power devices, persons of skill in the art will understand that the principals and embodiments presented herein are also applicable to small signal devices whose lead lengths and proximity are sufficient to result in significant inductive feedback from output to input.

Figure 1:
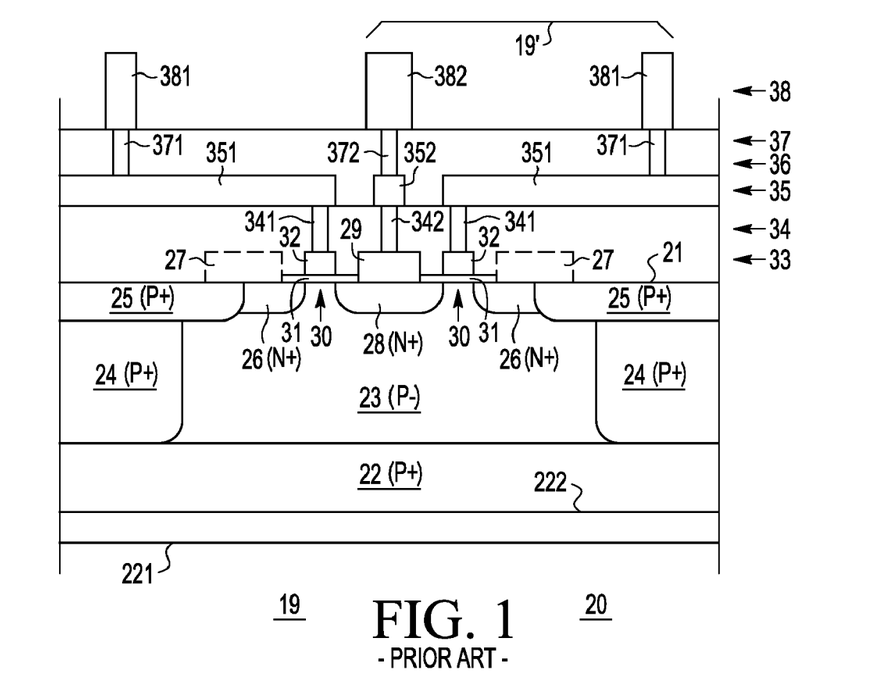
FIGS. 1-2 are simplified schematic cross-sectional and plan views, respectively, of an illustrative power metal-oxide-semiconductor (MOS) field effect transistor (FET), generally referred to as a "MOSFET," according to the prior art.
Figure 2:
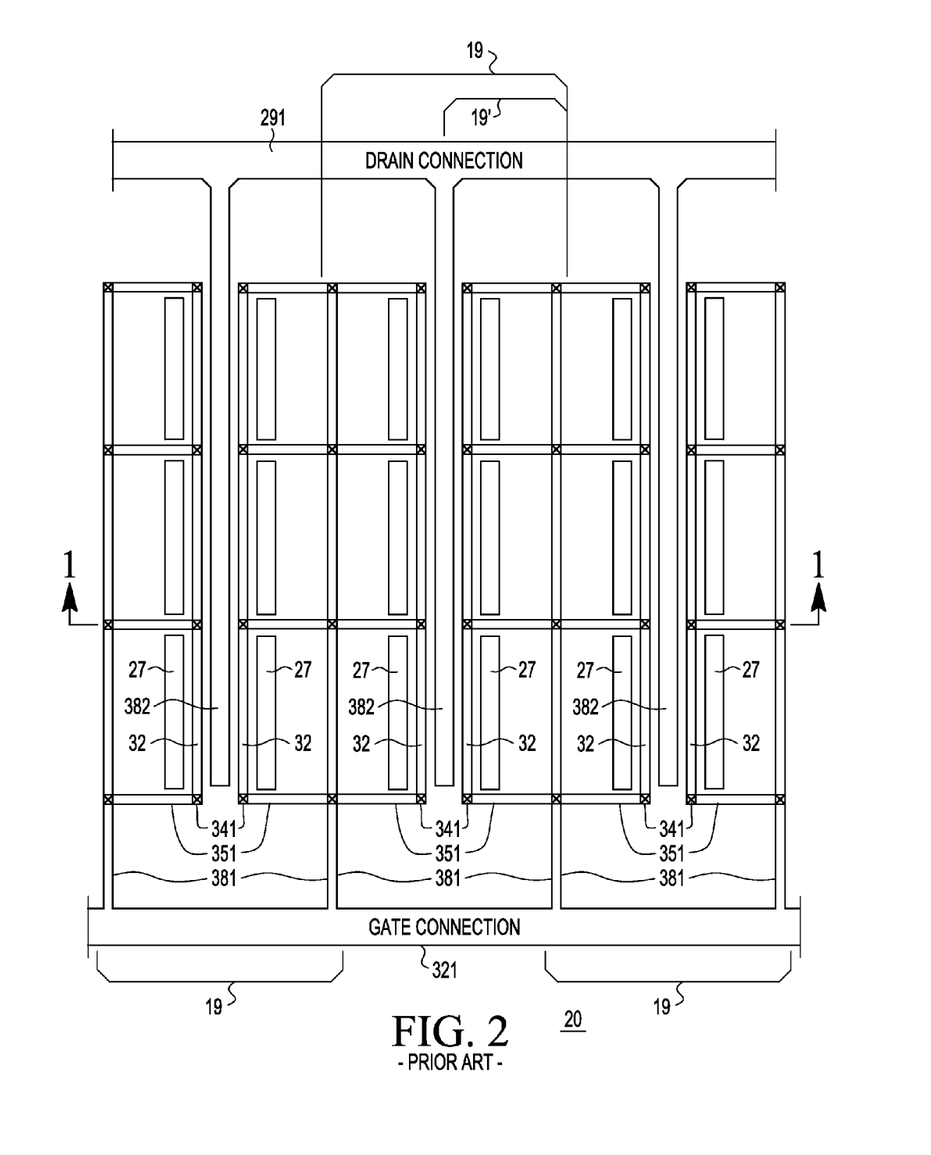

FIGS. 1-2 are simplified schematic cross-sectional and plan views, respectively, of illustrative power metal-oxide-semiconductor (MOS) field effect transistor (FET) 20, generally referred to as a "MOSFET," according to the prior art. FIG. 1 shows a cross-sectional view of single section 19 of device 20 and FIG. 2 shows a plan view of an array of (three) sections 19 of device 20. It will be understood by those of skill in the art, that many more or fewer than three parallel device sections 19 may be provided. Reference number 19' is intended to refer to half of a section 19. In other embodiments, device 20 may also be a lateral diffused MOSFET, i.e., referred to as an "LDMOS" transistor. Referring now to FIG. 1, section 19 of device 20 comprises substrate 22 (e.g., P+) having upper surface 21. In a preferred embodiment, back-side conductor or contact 221 (e.g., a high conductivity metal) is also included on rear face or lower surface 222 of substrate 22. Silicon is an example of a suitable material for substrate 22, but any semiconductor material may be used, including but not limited to those SC and substrate materials and structures mentioned above. In a preferred embodiment, substrate 22 comprises more lightly doped central region 23 (e.g., P−), sinker regions 24 (e.g., P+) on either side of region 23, body contact regions 25 (e.g., P+), source regions 26 (e.g., N+) and drain region 28 (e.g., N+). In other embodiments of the present invention, a through-substrate-via (TSV) of conductive material (e.g., a metal or metal alloy) may be substituted for sinker regions 24 to couple body contact 25 and source regions 26 to back-side contact 221. Conductors 27 (e.g., metal and/or silicide) are provided on or above surface 21 ohmically coupled to body contacts 25 and sources 26. (Conductors 27 are shown in dashed outline in FIG. 1 since they can have gaps underlying gate coupling conductors 351 described later.) Conductor 29 (e.g., metal and/or silicide) is usefully provided on surface 21 ohmically coupled to drain region 28. Gate dielectrics 31 (e.g., oxide or other insulator) overlies surface 21 of substrate 22 between source regions 26 and drain region 28. Gates 32 overlie gate dielectrics 31 and when appropriately biased give rise to channels 30 between sources 26 and drain 28. Metals and/or silicides (or analogous metal-semiconductor compounds) are non-limiting examples of materials suitable for gate 32, but other conductors are also useful. Persons of skill in the art will understand that portion 19 of device 20 is, in this example, a double MOSFET wherein two source regions 26 feed single drain region 28, and that portion 19' comprises half of section 19 with one source region and one drain region, but this is merely intended to be illustrative and not limiting. Dielectric layer 33 is provided over surface 21, source and drain conductors 27, 29 and gates 32. Conductors 341 extend through dielectric layer 33 to make Ohmic contact to gates 32. Conductor 342 extends through dielectric layer 33 to make Ohmic contact to drain conductor 29. Conductors 341, 342 are referred to collectively as conductors 34. Conductor 35 (often referred to as "first metal") overlies dielectric layer 33 and has portions 351 contacting conductors 341 and portion 352 contacting conductor 342. Dielectric layer 36 overlies conductor 35 and has conductor portions 371 therein making Ohmic contact with portions 351 of conductor 35 and portion 372 therein making Ohmic contact with conductor portion 352. Portions 371, 372 are referred to collectively as conductors 37. Conductor layer 38 overlies dielectric layer 36 and is often referred to as "second metal". Conductor layer 38 has conductor portion 381 in Ohmic contact with underlying conductors 371 and portion 382 in ohmic contact with underlying conductor 372. Conductor portions 381 are referred to as the "gate bus" and are coupled to gates 32 via conductor portions 371, 351 and 341. Conductor 382 is referred to as the drain bus and is coupled to drain region 28 via intermediate conductors 372, 352, 342 and 29. Further dielectric and interconnect layers that may be present on device 20 for passivation, isolation and/or interconnection purposes are omitted in FIGS. 1-2 (and 6-7) to avoid unduly cluttering the drawings. In FIG. 2, drain connection 291 is coupled to drain buses 382 and drains 29 and gate connection 321 is coupled to gate buses 381 and gates 32. The location of the cross section view of FIG. 1 is indicated on FIG. 2. Underlying body contacts 25, sources 26, drain 28, channels 30, gate dielectrics 31 gates 32, intermediate drain connections 372, 352, 343 and 29, and back-side conductor or contact 221 are not shown in FIG. 2 to avoid unduly cluttering the drawing. In the example of FIGS. 1-2, source contacts 27 are electrically coupled to backside metal 221 via doped regions 24, 25, but in other embodiments, may be coupled a suitable reference electrode via front surface connections. Either arrangement is useful.

Figure 3:
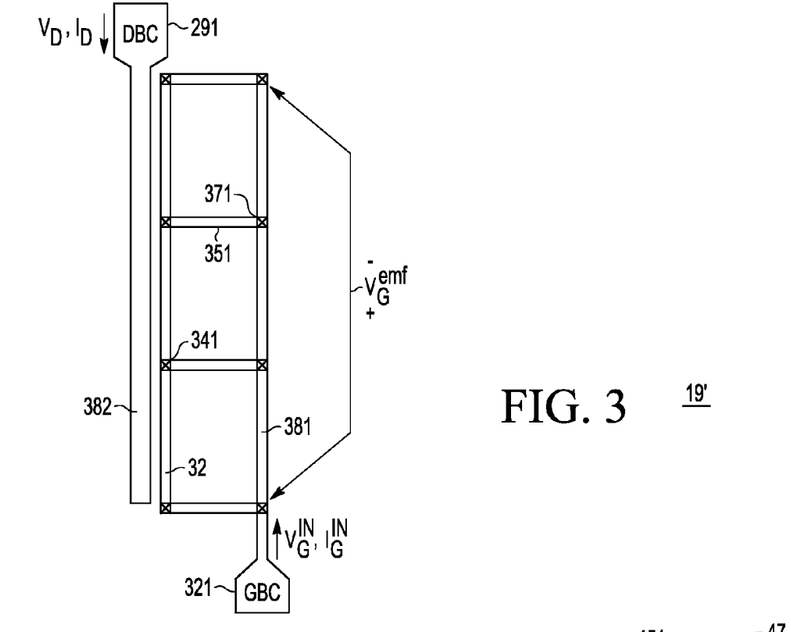
FIG. 3 is a simplified plan view of a portion of the power MOSFET illustrated in FIGS. 1-2, showing how inductive feedback is coupled from the drain to the gate of such power MOSFET.
Figure 4:
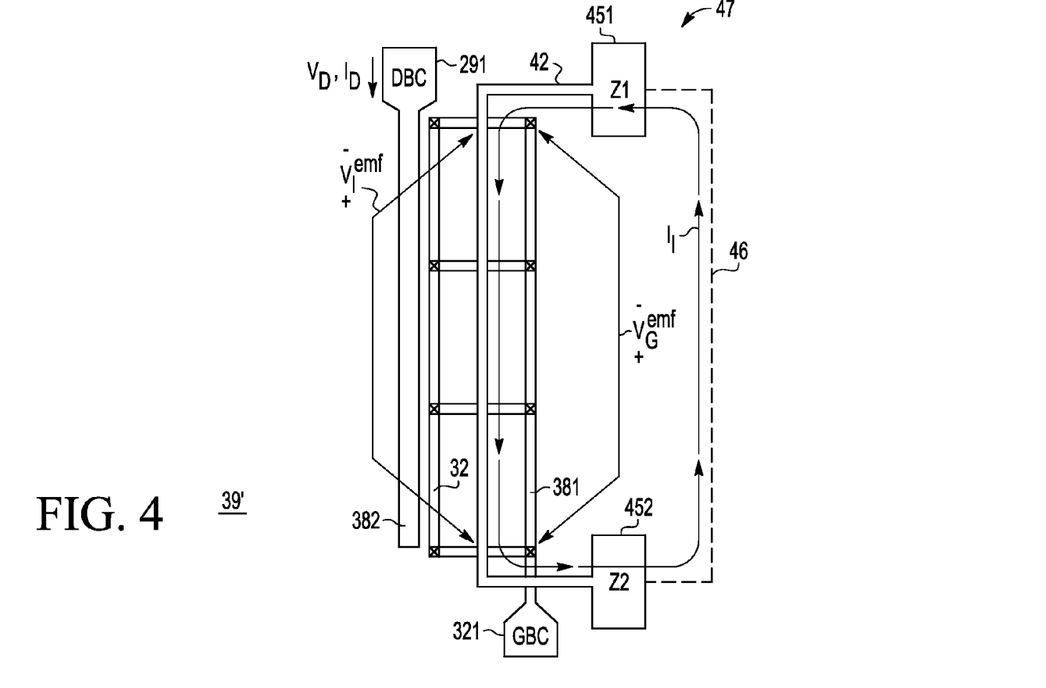
FIG. 4 is a simplified plan view analogous to that of FIG. 3 but with the addition of an inductive interposer according to an embodiment of the present invention to reduce and/or control inductive feedback from the drain to the gate of such MOSFET.

FIG. 3 is a simplified plan view of portion 19' of section 19 of power MOSFET 20 illustrated in FIGS. 1-2, showing how inductive feedback is coupled from drain bus 382 and drain 28 to gate bus 381 and gate 32 of power MOSFET 19, 20. FIG. 4 is a simplified plan view analogous to that of FIG. 3 of portion 39' analogous to portion 19' but with the addition of inductive interposer 42 according to an embodiment of the present invention to modify inductive feedback from drain bus 382 and drain 28 to gate bus 381 and gate 32 of MOSFET 39, 40 of FIGS. 6-7. The analysis is first conducted for the arrangement of FIGS. 1-3 and then extended to the arrangement of FIGS. 4 and 6-7.

Referring now to FIG. 3, drain bus connection (DBC) 291, gate bus connection (GBC) 321, drain bus 382, gate bus 381, gate 32 and gate bus to gate interconnections 371, 351, 341 are indicated for simplified portion 19' of single section 19 of power MOSFET 20. The time varying (e.g., AC) drain current $I_D$ flowing in drain bus 382 in response to drain voltage $V_D$ and input voltage $V_G$ creates (see also FIG. 5) a time varying magnetic field that extends to gate bus 381. This time varying magnetic field induces voltage $V_G^{emf}$ on gate bus 381 through mutual inductance $M_{GD}$ (e.g. see FIG. 5) between gate bus 381 and drain bus 382, which voltage is coupled to gate 32 and adds to or subtracts from incoming gate signal $V_G^{IN}$ according to the phase and polarity of the drain current $I_D$.

Equations for the self inductance of straight conductors and the mutual inductance between two substantially parallel conductors are well known. (Persons of skill in the art will understand that perfect parallelism is not required for such theoretical analysis to be useful.) However these equations typically describe a situation where the current is uniform along the length of each conductor. Within device 20 and sections and portions 19, 19', this is not the case. Drain bus 382 and drain conductor 29 (see FIGS. 1-2) feed current into diffused drain region 28 along the entire width of gate 32. Consequently the magnitude of the current in the drain bus decreases roughly linearly from drain connection 291 (once drain region 28 has been reached) to the far end of drain bus 382. An analogous situation exists in the gate bus, except that the current steps down in magnitude at each gate tap or interconnection 351 coupling gate bus 381 and gate 32 (see FIGS. 1-2).

The mutual inductance between transistor metal lines can be analyzed using Neuman's equation for straight parallel conductors, combined with the Method of Images. The mutual inductance $M_{12}$ between two substantially identical, parallel, aligned conductors can be calculated using Neuman's equation, as follows:

$$M_{12} = \frac{\mu}{4\pi} \int_0^l \int_0^l \frac{\hat{I}_1(x_1)\hat{I}_2(x_2)}{\sqrt{(x_1-x_2)^2 + d^2}} dx_1\, dx_2 \qquad \text{Eq. 1}$$

In this equation d is the distance between the conductors, $x_1$ and $x_2$ are the position coordinates along each conductor, and $\hat{I}_1(x_1)$ and $\hat{I}_2(x_1)$ are the currents on each conductor normalized to their respective terminal current. When the currents along the conductor length are uniform, then $\hat{I}_1(x_1)$ and $\hat{I}_2(x_1)$ are constant and equal to 1 because of the normalization. However, within the transistor one must take account of the graded current along the drain conductor (e.g., drain bus 382) and the stepped current along gate bus 381. For simplicity, both currents are approximated as being linearly graded, with one increasing while the other decreases along their lengths. Then, $$\hat{I}_D(x_D) = x_D/l \qquad \text{Eq. 2}$$

$$\hat{I}_G(x_G) = 1 - x_G/l \qquad \text{Eq. 3}$$

so the mutual inductance $M^{FS}_{GD}$ is $$M_{GD}^{FS} = \frac{\mu}{4\pi} \frac{1}{l^2} \int_0^l \int_0^l \frac{x_D \times (l - x_G)}{\sqrt{(x_D - x_G)^2 + d^2}} dx_D\, dx_G. \qquad \text{Eq. 4}$$

In this equation, and others to follow, the superscript "FS" indicates the result in free space and the subscript GD indicates that the mutual inductance is between the drain and gate of the device, where "drain" refers more generally to the output power lead and "gate" refers more generally to the input control lead. Performing the integrations leads to the result:

$$M_{GD}^{FS}[l,d] = \frac{\mu l}{4\pi} \left( \frac{1}{3}\log\left[\frac{l + \sqrt{l^2 + d^2}}{d}\right] - \frac{l \times (2d + \sqrt{l^2 + d^2})}{9(d + \sqrt{l^2 + d^2})^2} \right). \qquad \text{Eq. 5}$$

One needs to account for substrate 22 of device 20 and any underlying back-side conductor or contact (e.g., conductor or contact 221) that can act as a ground plane underlying device 20. This is accomplished by using the Method of Images. In this method, the analysis proceeds in free space, but with image conductors placed below the plane of the virtual ground. These image conductors have exactly mirrored geometries of the corresponding original conductors. Each image conductor has the opposite charge and current of its corresponding original conductor. This creates a virtual ground at the mirror plane with electric potential zero and magnetic fields excluded from the plane. The effect on the mutual inductance calculation is that the mutual inductance to the image conductor can now be included. If the conductors being analyzed are at a height H above the virtual ground, then the image conductor is at height −H, and so the vertical distance is 2H. Designate the lateral distance between gate and drain buss d. Then the lateral distance to the image conductor is $\sqrt{d^2 + 4H^2}$.

Let $M_{GD}[L,d,H]$ be the mutual inductance between gate bus and drain bus including ground plane effect. Then:

$$M_{GD}[l,d,H] = M_{GD}^{FS}[l,d] - M_{GD}^{FS}[l,\sqrt{d^2+4H^2}], \qquad \text{Eq. 6}$$

and the total induced voltage, or electromagnetic force (emf), on the gate bus due to the current on the drain bus produced by this mutual inductance is:

$$V_G^{emf} = j\omega M_{GD} I_D. \qquad \text{Eq. 7}$$

Similarly, the gate current induces a voltage on the drain bus. However, it is the voltage induced on the gate bus that is crucial, since any signal appearing on the gate bus is fed back into the transistor and is amplified by the gain of the device. Another important practical matter is that Eq. 7 describes the total voltage drop end-to-end on the gate bus induced by the mutual inductance. The "average" voltage as a function of position is less than the total drop. For the average signal induced on the gate by the drain current, one can use ½ of the above result.

Now consider two device geometries, case A and case B, shown respectively in FIGS. 3 and 4. These layouts illustrate single transistor cells or portions 19', 39' and show the drain bus 382, gate 32, and gate bus 381 with coupling leads 371, 351, 341. As noted in connection with device sections 19 of FIGS. 1-2 and device sections 39 of FIGS. 6-7, portions 19', 39' are often used in mirrored pairs, so that paired sources 26 share common drain 28. Typical power transistors 20, 40 can include a multitude of such paired sections 19, 39. Section 19 of FIGS. 1-2 and portion 19' of FIG. 3 are representative of a standard LDMOS device. FIG. 4 is a simplified plan view of the MOSFET portion illustrated in FIG. 3 but with the addition of inductive interposer 42 provided between gate bus 381 and drain bus 382, thereby comprising portion 39' of section 39 of FIGS. 6-7. The arrangement of FIG. 4 is generally otherwise similar to a standard LDMOS power MOSFET 19', 19, 20 but with inductive interposer 42 located between drain bus 382 and gate bus 381 (see FIGS. 6-7 for further details). Inductive interposer 42 forms part of closed circuit 47. Interposer current $I_P$, which is magnetically induced by drain current $I_D$, flows through circuit 47 comprising interposer 42. In the embodiment shown in FIG. 4, inductive interposer 42 is connected to series impedances Z1, Z2 indicated at connection pads 451, 452 (collectively 45) which are in turn coupled by current return interconnection 46. Inductive interposer 42 in closed circuit 47, for example, with one or more of series impedances Z1, Z2 and interconnection 46, forms a feed back network driven by the mutual inductances of all conductors present. In the illustrative embodiments, there is no direct electrical connection between inductive interposer 42 and either the drain side (e.g., drain 28, drain conductor 29, drain bus 382 and interconnections 342, 352, 372) or gate side (e.g., gate 32, gate bus 381 and interconnections 341, 351, 371) of device 39', 39, 40 of FIGS. 4-7 and inductive interposer 42 is direct current (DC) isolated therefrom. However, in other embodiments, a DC connection may be desirable, for example, to also facilitate electric field and stray capacitance control.

A complete analysis of a typical power transistor needs to consider the entire multitude of cells simultaneously, including mutual inductances between all of the interconnections. However, useful insight is obtained by considering just single unit cell or portion 19' of FIG. 3 and portion 39' of FIG. 4. Current and voltage variables are illustrated in FIGS. 3-4. These variables are also described in Table I below. Using the relations for mutual inductances described previously, and considering the current distribution profile on each of the conductors, one can immediately write the expression for the average signal induced on gate bus 381 for the arrangement of FIG. 3, as:

$$V_{G,AVE}^{emf} = j\omega \frac{M_{GD}}{2} I_D. \quad \text{Eq. 8}$$

In contrast, additional considerations arise for the situation in FIG. 4. Inductive interposer 42 has mutual inductance with both gate bus 381 and drain bus 382, and terminates in series impedances Z1, Z2 coupled by interconnection 46. For simplicity of analysis, it is assumed hereafter that $Z1=Z_T$ and $Z2=0$ or alternatively that $Z1+Z2=Z_T$ and that all of the connection resistance is lumped at one of contacts 451, 452 (collectively 45). The resistance associated with conductive interconnection 46 (e.g., a through-substrate connection via sinkers 24 and/or a through-substrate-via (TSV) to a highly conductive back electrode such as conductor 221) is neglected for the present. Its impact is assessed later by using non-zero resistive values for $Z_T$. In this situation the current is constant along the length of inductive interposer 42 (neglecting the current lost to charging the line capacitance) in contrast to gate bus 381 and drain bus 382 where the current varies along the bus. Again using Neuman's equation, the free space mutual inductance $M_{GI}^{FS}$ between gate bus 381 and interposer 42 is:

$$M_{GI}^{FS}[l, d_{GI}] = \frac{\mu}{4\pi} \frac{1}{l^2} \int_0^l \int_0^l \frac{l - x_G}{\sqrt{(x_I - x_G)^2 + d_{GI}^2}} dx_I dx_G \quad \text{Eq. 9}$$

$$= \frac{\mu l}{4\pi}\left(\log\left[\frac{l + \sqrt{l^2 + d_{GI}^2}}{d_{GI}}\right] - \frac{l}{d_{GI} + \sqrt{l^2 + d_{GI}^2}}\right). \quad \text{Eq. 10}$$

Then using the Method of Images, the mutual inductance $M_{GI}$ between gate bus 382 and interposer 42, including the effect of ground plane, is $$M_{GI}[L,d,H] = M_{GI}^{FS}[l,d] - M_{GI}^{FS}[l,\sqrt{d^2+4H^2}]. \quad \text{Eq. 11}$$

The expression for the free space mutual inductance $M_{ID}$ between inductive interposer 42 and drain bus 382 is exactly analogous, as follows:

$$M_{ID}^{FS}[l, d_{ID}] = \frac{\mu l}{4\pi}\left(\log\left[\frac{l + \sqrt{l^2 + d_{ID}^2}}{d_{ID}}\right] - \frac{l}{d_{ID} + \sqrt{l^2 + d_{ID}^2}}\right). \quad \text{Eq. 13}$$

Again using the Method of Images, the mutual inductance $M_{ID}$ between interposer and drain metal, including the effect of ground plane, is $$M_{ID}[l,d,H] = M_{ID}^{FS}[l,d] - M_{ID}^{FS}[l,\sqrt{d^2+4H^2}]. \quad \text{Eq. 14}$$

Table I below provides definitions of the terms used in the foregoing equations.

TABLE I

DEFIINITION OF TERMS

| Symbol | Definition |
|---|---|
| $C_{ds}$ | Drain to source capacitance |
| $C_{gd}$ | Gate to drain capacitance |
| $C_{gs}$ | Gate to source capacitance |
| $g_m$ | Transistor transconductance |
| $I_D$ | Current at drain terminal |
| $I_G$ | Current at gate terminal |
| $I_I$ | Current on inductive interposer |
| l | Length of gate bus and drain metal. Treated as roughly equal in this discussion |
| $L_D$ | Self inductance of drain metal line |
| $L_G$ | Self inductance of gate bus metal line |
| $L_I$ | Self inductance of interposer metal line |
| $M_{GD}^{FS}$ | Free space mutual inductance between gate bus and drain metal |
| $M_{GI}^{FS}$ | Free space mutual inductance between gate bus and interposer |
| $M_{ID}^{FS}$ | Free space mutual inductance between interposer and drain metal |
| $M_{GD}$ | Mutual inductance between gate bus and drain metal with ground plane present |
| $M_{GI}$ | Mutual inductance between gate bus and interposer with ground plane present |
| $M_{ID}$ | Mutual inductance between interposer and drain metal with ground plane present |
| $R_I$ | Resistance of interposer metal line |
| $V_D$ | Voltage at gate terminal |
| $V_G$ | Input voltage at gate terminal |
| $v_{gs}$ | Gate to source voltage as seen at transistor gate |
| $V_G^{emf}$ | Total electromotive force induced on the gate bus |
| $V_{G,AVE}^{emf}$ | Electromotive force induced on the gate bus averaged along its length |
| $V_I^{emf}$ | Total electromotive force induced on the interposer metal line |
| $Z_O$ | Reference impedance of measurement system |
| $Z_T$ | Terminating impedance of feedback circuit |

Figure 5:
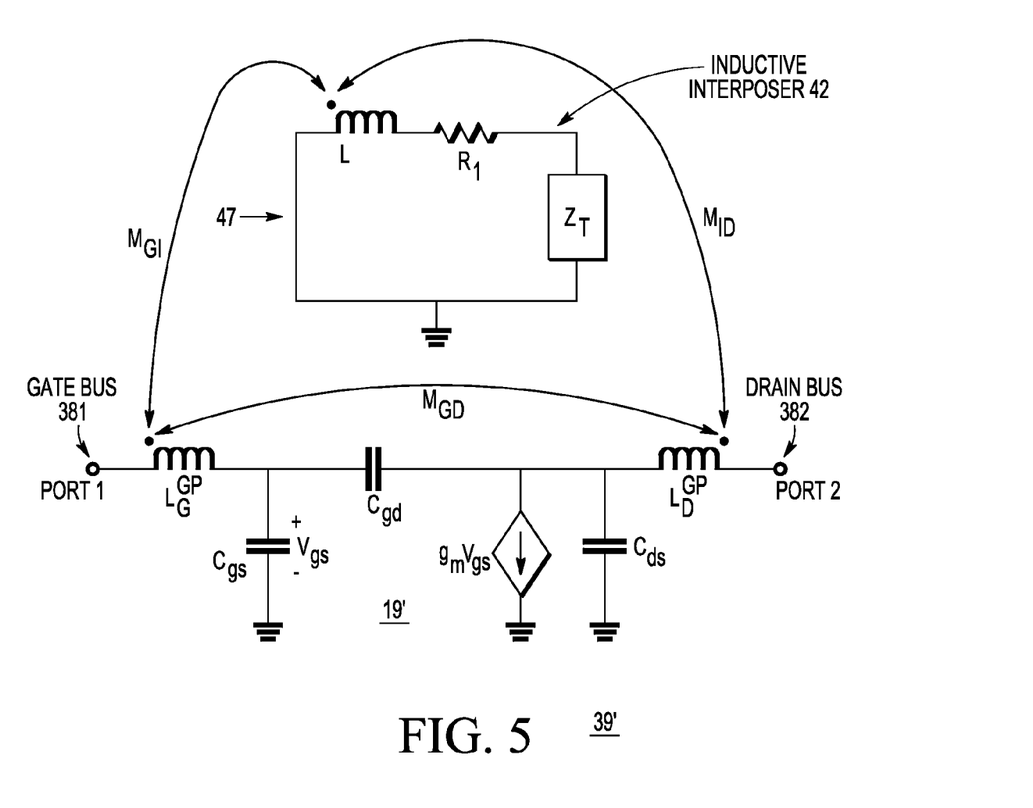
FIG. 5 is a simplified equivalent circuit diagram of the MOSFET portions depicted in FIGS. 3-4, useful for analysis of the inductive coupling between the drain and gate of the MOSFET portions of FIGS. 3 and 4 and for incorporating the action of the inductive interposer of FIG. 4.

FIG. 5 is a simplified equivalent circuit diagram of MOSFET portion 39' comprising MOSFET portion 19' of FIG. 3 with inductive interposer 42 shown in FIG. 4, and is useful for analysis of the inductive coupling between drain and gate of MOSFET portion 19' of FIG. 3 and for incorporating the action of inductive interposer 42 of FIG. 4 in closed circuit 47. Based on the equivalent circuit of FIG. 5 and Equations 1-14, it is possible to proceed with a small signal analysis of the arrangement of FIG. 4 to obtain an analytical expression that describes the main features of the mutual inductance feedback mechanism. In contrast to lower frequency analog circuits, RF devices are typically characterized in terms of Scattering Parameters, referred to as "S" parameters. These S parameters are reflection and transmission coefficients that describe the effect a device or combination of circuit elements has on an incident wave, or signal. The incoming signal wave is either reflected back toward its origin, or transmitted through the device to other ports. For convenience of analysis, the transistors described herein are treated as two port devices, wherein Port 1 corresponds to gate bus 381 and Port 2 corresponds to drain bus 382. To characterize feedback in a transistor, the relevant S parameter is S12 which describes the coupling between Ports 1 and 2. S12 is defined as the transmission coefficient of the wave exiting the device at Port 1, e.g., gate bus 381, due to an incident wave at Port 2, the e.g., drain bus 382.

Equations 15-17 can be written to describe the layout in FIG. 4. Specifically:

$$0 = j\omega L_I I_I + R_I I_I + V_I^{emf} + Z_T I_I \qquad \text{Eq. 15}$$

$$V_I^{emf} = -j\omega M_{GI} I_G + j\omega M_{ID} I_D \qquad \text{Eq. 16}$$

$$V_G^{emf} = -j\omega M_{GI} I_I + j\omega M_{GD} I_D \qquad \text{Eq. 17}$$

Equations 15-17 are written such that the mutual inductance parameters are positive, so the sign of the mutual inductances are shown explicitly. Using these relations as a guide, a simplified small signal model for the transistor plus feedback can be written corresponding to FIGS. 3-4 yielding an expression for S12, as follows:

$$S12 = \frac{2Z_O\left(-j\omega M_{GD} - \frac{\omega^2 M_{GI} M_{ID}}{R_I + j\omega L_I + Z_T} + \frac{1}{g_m + j\omega C_X}\right)}{\Delta S}, \qquad \text{Eq. 18}$$

where $Z_O$ is the reference impedance of the measurement system, and $$C_X = C_{gs} + C_{ds} + \frac{C_{gs} C_{ds}}{C_{gd}}, \qquad \text{Eq. 19}$$

And $$\Delta S = \left(Z_O + j\omega L_G + \frac{\omega^2 M_{GI}^2}{R_I + j\omega L_I + Z_T} + \frac{1 + C_{ds}/C_{gd}}{g_m + j\omega C_X}\right) \\ \left(Z_O + j\omega L_D + \frac{\omega^2 M_{ID}^2}{R_I + j\omega L_I + Z_T} + \frac{1 + C_{gs}/C_{gd}}{g_m + j\omega C_X}\right) - \\ \left(-j\omega M_{GD} + \frac{\omega^2 M_{GI} M_{ID}}{R_I + j\omega L_I + Z_T} + \frac{1}{g_m + j\omega C_X}\right) \\ \left(-j\omega M_{GD} + \frac{\omega^2 M_{GI} M_{ID}}{R_I + j\omega L_I + Z_T} + \frac{1 + j g_m/(\omega C_{gd})}{g_m + j\omega C_X}\right). \qquad \text{Eq. 20}$$

Using Eqs. 18-20 for S12, a number of special cases can be examined:

Special case 1: $Z_T \rightarrow \infty$. In this case the second term within the numerator parentheses vanishes, and in this limit $$S12 \rightarrow \frac{2Z_O\left(-j\omega M_{GD} + \frac{1}{g_m + j\omega C_X}\right)}{\Delta S}. \qquad \text{Eq. 21}$$

This corresponds to a standard LDMOS device without inductive interposer 42, that is, to portion 19' of FIG. 3 and prior art device 19, 20 of FIGS. 1-2. The infinite impedance of $Z_T$ prevents any current flow in inductive interposer 42 and no inductive feedback compensation effect is present.

Special case 2: $Z_T = 1/(j\omega C_T)$. In this case, $Z_T$ is in the form of, for example, an integrated capacitor of value $C_T$ chosen to resonate with the self inductance of inductive interposer 42.

Substituting the expression for $Z_T$ into the equations for S12 makes the resonance explicit, and $$S12 = \frac{2Z_O\left(-j\omega M_{GD} - \frac{\omega^2 M_{GI} M_{ID}}{R_I + j\left(\omega L_I - \frac{1}{\omega C_T}\right)} + \frac{1}{g_m + j\omega C_X}\right)}{\Delta S}. \qquad \text{Eq. 22}$$

Special case 3: $Z_T R_I \ll j\omega L$. Small values for $Z_T$ and $R_I$ have the effect of allowing large current flow in interposer 42, which current opposes the ordinary mutual inductance coupling between drain and gate and reduces the total effective drain-gate mutual inductance so that S12 becomes:

$$S12 = \frac{2Z_O\left(-j\omega\left(M_{GD} - \frac{M_{GI} M_{ID}}{L_I}\right) + \frac{1}{g_m + j\omega C_X}\right)}{\Delta S}. \qquad \text{Eq. 23}$$

These special cases illustrate how the inductive feedback response may be modified by, for example:

(1) (See special case 1) increasing the series resistance within $Z_T$ so that the effect on the feedback due to interposer 42 is reduced;

(2) (See special case 2) using an impedance $Z_T$ that can resonate with the self inductance of the interposer so that, for example, the feedback is altered at the resonant frequency or frequencies; and (3) (See special case 3) using a $Z_T$ in the form of a low resistance that allows additional current to flow in interposer 42, which current opposes the normal drain-gate mutual inductance thereby reducing the effective mutual inductance.

These and other embodiments of the present invention (e.g., where $Z_T$ comprises resistance, capacitance, inductance and/or various combinations thereof including frequency dependant impedances) provide the device designer with additional degrees of freedom for determining the transistor characteristics at the fundamental frequency as well as at various harmonics. The manner in which impedances $Z_T$ of various types can be incorporated in closed loop circuit 47 is discussed in more detail in connection with FIGS. 4 and 6-7. In the final product, the total feedback is the due to the combination of the inherent feedback of the transistor such as is described here, together with the self and mutual inductance of the bond wires and package. In addition to compensating for undesirable inductive feedback within the transistor and its immediate bus structure, further embodiments of the present invention may also be used to compensate for bond wire and package affects outside the immediate device environment since the effects are additive.

Figure 6:
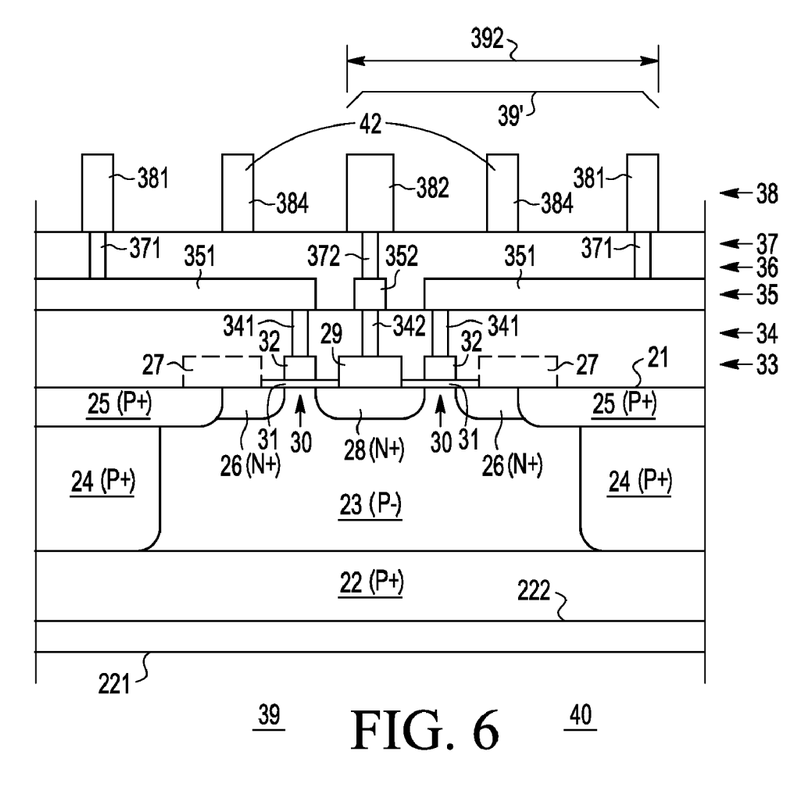
FIGS. 6-7 are simplified schematic cross-sectional and plan views, respectively, of a power MOSFET including the inductive interposer illustrated generally in FIGS. 4-5 but showing additional details, according to further embodiments of the present invention.
Figure 7:
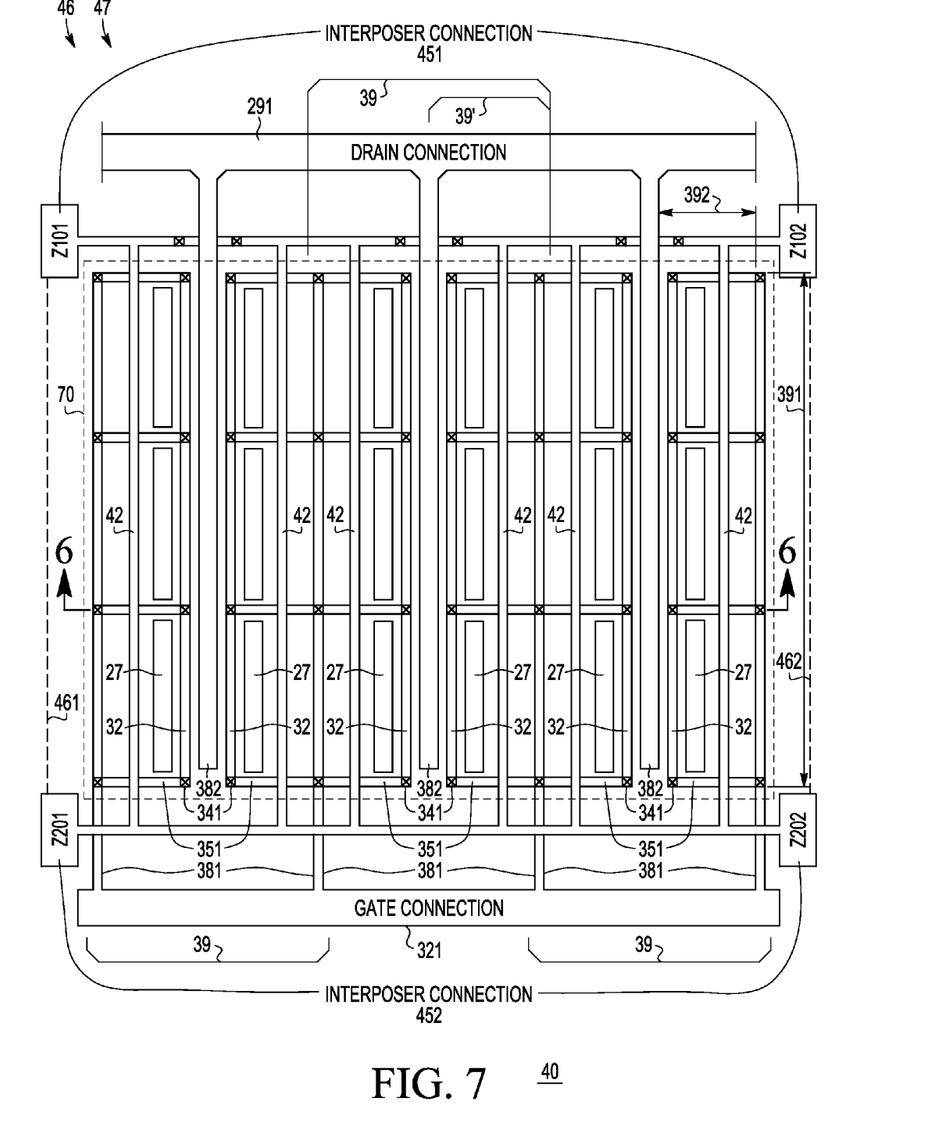

FIGS. 6-7 are simplified schematic cross-sectional and plan views, respectively, of power MOSFET 40 comprising multiple sections 39 including inductive interposer 42 of FIGS. 4-5 but showing additional details and according to still further embodiments of the present invention. The same reference numbers have been used to identify elements of sections 39 and device 40 of FIGS. 6-7 that are common with those of sections 19 and device 20 of FIGS. 1-2 and reference should be had to the description thereof in connection with FIGS. 1-2. The embodiments of FIGS. 6-7 differ from that of FIGS. 1-2 by inclusion of inductive interposer 42 (as part of closed circuit 47 of FIGS. 4-5). In this embodiment, inductive interposer 42 comprises conductor(s) 384 of conductor layer (e.g., second metal) 38 located approximately midway between drain bus 382 and gate bus 381, but in other embodiments, conductor(s) 384 may be placed at other locations between drain bus 382 and gate bus 381. Inductive interposer 42 is an electrical conductor that is part of closed electrical circuit 47, wherein an inductively induced current flows in the closed loop of circuit 47. In FIG. 4, inductive interposer 42 is coupled at each end to terminals Z1, Z2 which are in turn coupled together by conductive path or interconnection 46 to form closed loop circuit 47. In FIG. 7, interposer connection 451 and terminals or impedances Z101, Z102 are analogous to terminals or impedance Z1 and interposer connection 452 and terminals Z201, Z202 are analogous to terminal or impedance Z2.

In connection with the embodiment illustrated by FIG. 4, various impedances $Z_T$ can be conveniently incorporated in closed loop circuit 47 by building them into or underneath one or both of terminals Z1, Z2 and/or into interconnection 46. For example, where $Z_T$ is intended to be resistive, the magnitude of the resistance may be controlled by adjusting the resistance of interconnection 46, for example and not intended to be limiting, by controlling the doping of one or both sinker regions or TSVs coupling terminals Z1, Z2 to back-side conductor 221 of FIG. 6 or the local width or thickness of that portion of back-side conductor 221 coupling the sinkers or TSVs connected to terminals Z1, Z2. Further, where $Z_T$ is intended to be capacitive, the magnitude of the capacitance may be controlled by, for example and not intended to be limiting, by placing a dielectric under one or both terminals Z1, Z2 so that it or they form one plate of the capacitor wherein the semiconductor sinker region or TSV underlying the dielectric and ohmically coupled to back-side conductor 221 of FIG. 6 forms the other plate of the capacitor. By adjusting the area of one or both terminals Z1, Z2 and the dielectric thickness, the capacitance being included in the closed circuit 47 may be predetermined. Where $Z_T$ is intended to be inductive, the magnitude of the inductance may be adjusted by, for example and not intended to be limiting, adjusting the length and configuration of the portion of back-side conductor 221 that is used to couple terminals Z1, Z2 together via the associated sinker regions or TSVs in contact with terminals Z1, Z2. By combining such arrangements, more complex impedances may be provided. It should be understood that while the preferred arrangement for coupling terminals Z1, Z2 is via sinkers or TSVs leading to back-side conductor(s) on substrate 22, which back-side conductor(s) may be grounded or electrically floating, that any other means for providing such coupling to complete closed loop circuit 47 may also be used. The arrangements described above with reference to the embodiment of FIG. 4 for incorporating resistance, capacitance, inductance or combinations thereof in closed loop circuit 47 also apply to the embodiment of FIG. 7, wherein connection 451 and terminals or impedances Z101, Z102 of FIG. 7 correspond to terminal or impedance Z1 of FIG. 4 and connection 452 and terminals or impedances Z201, 202 of FIG. 7 correspond to terminal or impedance Z2 of FIG. 4.

In some embodiments, it is desirable that inductive interposer 42 be generally parallel to the long dimensions of drain conductor 29 and/or drain bus 382 and of gate 32 and/or gate bus 381 since this facilitates inductive coupling. In still further embodiments inductive interposer 42 may be located in other conductor layers since it need not be on the same plane as drain bus 382 (and/or drain conductor 29) or gate bus 381 (and/or gate 32). The magnetic induction effects are three-dimensional, so it is not necessary that inductive interposer 42 be located in the same plane or on a line-of-sight between the drain and gate conductors and/or drain and gate buses being compensated. However, such line-of-sight arrangement is not precluded and is illustrated by way of example and not limitation in FIGS. 6-7 where interposer 42 comprising conductor(s) 384 lies substantially in the same plane as drain bus 382 and gate bus 381. Accordingly, as used herein, the terms "located between" or "located generally between" in reference to the position of the inductive interposer relative to the input and output electrodes, leads, conductors or buses is intended to include both in-plane (on a line of sight) and out-of-plane (not on a line-of-sight) arrangements.

Referring to FIG. 7, inductive interposer 42 is (e.g., parallel) coupled to interposer connections 451, 452 labeled for convenience as comprising impedances Z101, Z102 and Z201, Z202 respectively. Impedances or terminals Z101, Z102 correspond to impedance or terminal Z1 of FIG. 4 and impedances or terminals Z201, Z202 correspond to impedance or terminal Z2 of FIG. 4 and illustrate how multiple connections to inductive interposer 42 may be made in various embodiments. In FIG. 7, interconnection 46 of FIG. 4 comprises two interconnection portions 461, 462 (collectively 46) shown as dashed lines, wherein interconnection 461 joins impedances or terminals Z101 and Z201 and interconnection 462 joins impedances or terminals Z102 and Z202. It is assumed in FIG. 7 that interconnections 461, 462 (collectively 46) are provided by one or more connections out of the plane of FIG. 7 or elsewhere, as for example and not intended to be limiting, underlying one or more of terminals 451 (and impedances Z101, Z102) and 452 (and impedances Z201, 202) so as to couple terminals 451, 452 (and any resistive, capacitive and/or inductive impedances Z101, Z102, Z201, Z202 associated therewith) to back-side conductor 221 shown in FIG. 6 (e.g., via localized sinkers or TSVs in substrate 22 to back-side conductor 221) or via interconnections overlying surface 21 (e.g., on one of more of the interconnection layers 35, 36 shown in FIG. 6) so that inductive interposer 42 forms part of closed loop circuit 47 through which induced current $I_I$ (see FIG. 4) can flow. In those embodiments in which interconnection(s) 46 are placed above surface 21 rather than via back-side conductor 221 or a portion of back-side conductor 221, it is desirable that they be spaced sufficiently distant from interposer 42, input bus 381 and output bus 382 so as to not contribute significantly to the local magnetic fields in their vicinity. While in a preferred embodiment illustrated in FIG. 7, two interconnections 461, 462 are illustrated (collectively 46) this is not intended to be limiting and in other embodiments only one such interconnection or more than two such interconnections may be provided. Either arrangement is useful.

In a preferred embodiment, it is desirable that terminals or connections 451, 452 be located in plan view outside of the active area bounded, for example, by perimeter 70 of device 40. This provides a greater interaction between inductive interposer 42, drain bus 382 and/or drain conductor 29 and gate bus 381 and/or gate 32. If terminals or connections 451, 452 are located within the active area, for example and not intended to be limiting within active area perimeter 70 of device 40 of FIG. 7, then the inductive interaction provided by inductive interposer 42 may be reduced. Perimeter 70 is intended merely as an example of the active area of a device desirably to be avoided for contacts or connections 451, 452 leading to interconnection 46 (see FIG. 4) and not to be limiting and other plan view footprints, areas, shapes and/or perimeters may also be used for active area perimeter 70.

Based on the description herein, it will be appreciated that the embodiments of the inductive interposer structure are most useful when the input bus 381 and the output bus 382 run substantially parallel to each other for a distance 391 that is greater than or equal to their separation 392, especially when distance 391 is several or many times distance 392. For example, and not intended to be limiting, the ratio R of distance 391 divided by distance 392 is desirably in the range of about $1 \leq R \leq 100$, more conveniently in the range of about $4 \leq R \leq 60$, and preferably in the range of about $8 \leq R \leq 25$. In general, other things being equal, the larger R, the more useful the inductive interposer structure described herein. Other considerations may eventually impose limitations on the overall length in practical cases. It will be appreciated by those of skill in the art, that the various leads or buses need not be perfectly parallel for the inductive coupling described herein to occur and the term "substantially parallel" is intended to include departures from perfect parallelism where significant inductive coupling between conductors running in approximately the same overall direction still occurs. Further, the plan view spacing between the various conductors need not be constant but can vary along their length.

Figure 8:
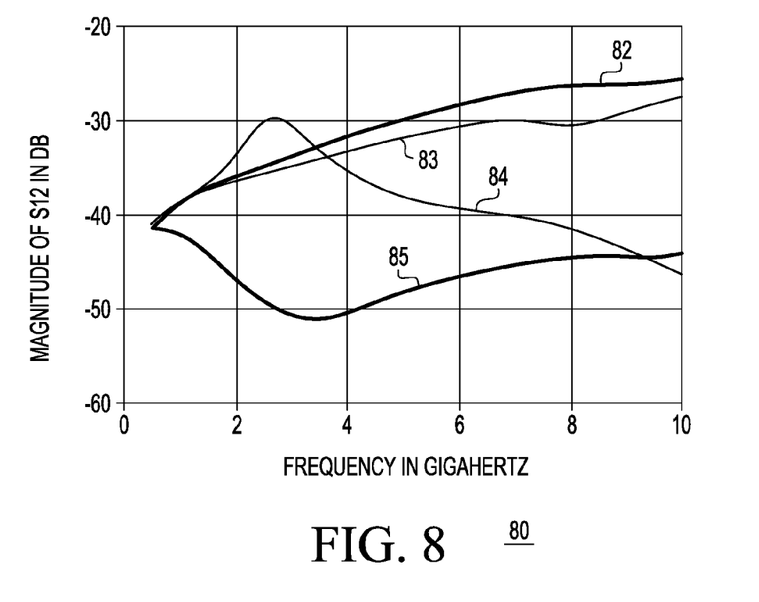
FIGS. 8-9 show plots of, respectively, the magnitude in decibels (FIG. 8) and the phase in degrees (FIG. 9) of the S-Parameter S12 versus transistor operating frequency (in Gigahertz) for the arrangement of FIGS. 1-3 and FIGS. 4 and 6-7, illustrating how the use of the inductive interposer of FIGS. 4 and 6-7 with different terminating impedances can impact drain-to-gate feedback.
Figure 9:
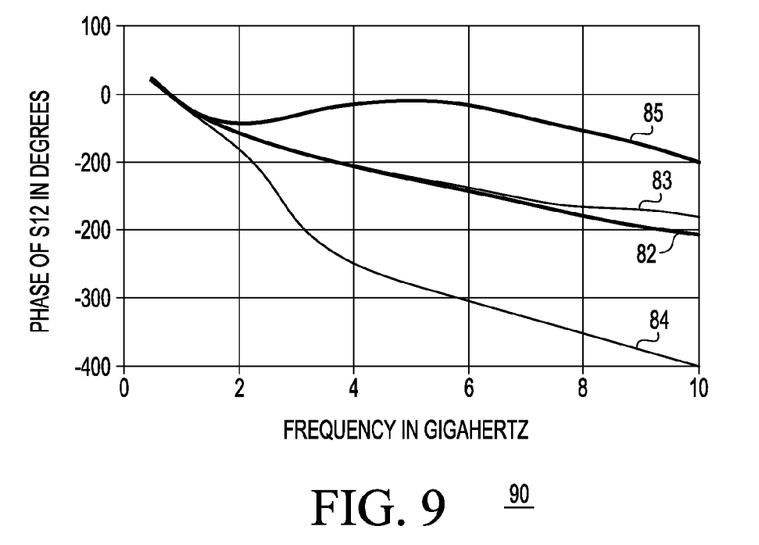

FIGS. 8-9 show plots 80, 90 of, respectively, the magnitude in decibels (plot 80 of FIG. 8) and the phase in degrees (plot 90 of FIG. 9) of the S-Parameter S12 versus transistor operating frequency (in Gigahertz) for the arrangement of FIGS. 1-3 and FIGS. 4 and 6-7, illustrating how the use of inductive interposer 42 of FIGS. 4 and 6-7 with different terminating impedances $Z_T$ can impact drain-to-gate feedback. The parameter S12 compares the feedback of the signal from the output (in this case the drain terminal) to the input (in this case the gate terminal). FIG. 8 shows the ratio of the magnitudes of the feedback signal to the drain signal and FIG. 9 shows the difference in phase of the feedback signal to the drain signal, both as a function of the operating frequency of the device. The measured devices each had substantially the same active area and source-drain spacing with eight gate fingers that were about 1000 micrometers wide and were operated at 3-9 milliamps/millimeter current density. The results were substantially independent of operating conditions. Trace 82 of plot 80 illustrates the feedback behavior for device 39', 39, 40 of FIGS. 4-7 corresponding to Special Case-1 when $Z_T = \infty$, that is, where inductive interposer 42 includes an open circuit so that no significant current flows in inductive interposer 42. Trace 83 of plot 80 illustrates the feedback behavior for prior art device 19', 19, 20 of FIGS. 1-2 where no inductive interposer 42 is present and, as expected, behaves substantially the same as for $Z_T = \infty$. Trace 84 of plot 80 illustrates the feedback behavior for device 39', 39, 40 of FIGS. 4-7 corresponding to the situation discussed in connection with Special Case-2 wherein a capacitor $C_T$ of about 10 picofarads was provided for $Z_T$ so as to resonate at about 2.7 gigahertz with the inherent inductance (e.g., ~0.35 nanohenries) of interposer 42 and interposer circuit 47. Trace 85 of plot 80 illustrates the feedback behavior for device 39', 39, 40 of FIGS. 4-7 corresponding to Special Case-3 when $Z_T$ was small and resistive, e.g., $Z_T \sim 0.25$ Ohms. It will be noted that by appropriately selecting $Z_T$, the drain-to-gate inductive feedback can be substantially modified to suit the needs of a particular device or circuit application. For example, by providing $Z_T$ that is a low resistance (e.g., $Z_T \leq \sim$ one Ohm), the inductive drain-to-gate feedback can be significantly attenuated. By using a capacitive element for $Z_T$, the feedback can be made to peak at a particular frequency and be sharply attenuated outside such resonant frequency. It will be further appreciated that by incorporating combinations of various circuit elements in $Z_T$, that other desirable feedback characteristics can also be obtained. In addition, it will be appreciated that electrically conductive inductive interposer 42 will also provide electric field shielding between drain 28 and/or drain conductor 29 and/or drain bus 382 and gate bus 381 and/or gate 32, thereby inherently also reducing undesirable drain-to-gate capacitive coupling and feedback. It should be noted that the converse is not true, that is, an ordinary prior art grounded or source coupled electric field gate shield as is often placed between the gate and drain conductors and/or buses does not inhibit drain-to-gate inductive coupling where such prior art shields lack the closed loop circuit arrangement provided for inductive interposer 42 (e.g., via terminals 451, 452 and interconnection 46 to form closed circuit 47). Thus, the various embodiments of the present invention provide feedback control that minimizes or avoids undesirable inductive (as well as electric field) feedback and further can allow the characteristics of the amplifier to be expressly tailored to suit the application in a way not previously available. This is a significant advance in the art.

According to a first embodiment, there is provided an electronic element (39', 39, 40), comprising, an amplifying device having an input (32) with an input conductor (381) and an output (28, 29) with an output conductor (382), wherein the input (381) and output (382) conductors are substantially parallel for a first distance (391) and spaced apart by a second average distance (392), and an electrically conductive inductive interposer (42) forming part of a closed loop circuit (47), wherein the inductive interposer (42) is located between the output conductor (382) and the input conductor (381). According to a further embodiment, a ratio R of the first distance (391) divided by the second distance (392) has a value $1 \leq R \leq 100$. According to a still further embodiment, R has a value $4 \leq R \leq 60$. According to a yet further embodiment, the inductive interposer (42) is DC electrically isolated from the output conductor (382) and the input conductor (381). According to a yet still further embodiment, the inductive interposer has end connections (451, 452; Z1, Z2; Z101/Z102, Z201/Z202) that are coupled by a further conductor (46) of the closed circuit (47), and wherein the end connections (451, 452; Z1, Z2; Z101/Z102, Z201/Z202) located substantially outside an active area perimeter (70) of the electronic element (39, 39', 40). According to a still yet further embodiment, the inductive interposer has end connections (451, 452; Z1, Z2; Z101/Z102, Z201/Z202) that are coupled by a further conductor (46) of the closed circuit (47), and wherein the end connections (451, 452; Z1, Z2; Z101/Z102, Z201/Z202) are located substantially outside an active area perimeter (70) of the electronic element (39, 39', 40). According to another embodiment, the closed circuit (47) containing the inductive interposer (42) further comprises an impedance $Z_T$ that is frequency dependant. According to a still another embodiment, the closed circuit (47) containing the inductive interposer (42) has a resistance less than or equal about one Ohm. According to a yet another embodiment, the input conductor (381), output conductor (382) and inductive interposer (42) lie substantially in the same plane. According to a still yet another embodiment, the input conductor (381) and the output conductor (382) lie substantially in a first plane and the inductive interposer (42) lies substantially in a second plane different than the first plane. According to a yet still another embodiment, the amplifying device is a MOSFET. According to an additional embodiment, the amplifying device is an LDMOS transistor.

According to a second embodiment, there is provided a MOSFET device (39, 39', 40) having a gate (32) and a drain (28), comprising, one or more input lead (381, 371, 351, 341) coupled to the gate (32), one or more output lead (382, 372, 352, 342, 29) coupled to the drain (28), wherein the one or more input lead (381, 371, 351, 341) and the one or more output lead (382, 372, 352, 342, 29) have portions (381, 382) that are spaced apart by at least a first distance (392) and substantially parallel along a second distance (391) larger than the first distance (392), and an electrically conductive interposer lead (42) adapted to be magnetically coupled when operating to the portions (381, 382) of the one or more input lead (381, 371, 351, 341) and the one or more output lead (382, 372, 352, 342, 29), the interposer lead (42) forming part of a closed loop circuit (47). According to a further embodiment, when operating a voltage induced on the portion (381) of the one or more input lead (381, 371, 351, 341, 32) by a current flowing through the interposer lead (42) opposes a voltage induced on the portion (381) of the one or more input lead (381, 371, 351, 341, 32) by another current flowing through the portion (382) of the one or more output lead (382, 372, 352, 342, 29). According to a still further embodiment, the interposer lead (42) is located between the portion (381) of the one or more input lead (381, 371, 351, 341, 32) and the portion (382) of the one or more output lead (382, 372, 352, 342, 29). According to a yet further embodiment, the MOSFET device (39, 39', 40) is an LDMOS device. According to a still yet further embodiment, the closed loop circuit (47) has a resistance less than or equal about one Ohm.

According to a third embodiment, there is provided a semiconductor device (39, 39', 40), comprising, an input lead (381), an output lead (382) that runs substantially in the same general direction as the input lead (381) for a first distance (391) with an average separation (392) less than the first distance so as to be magnetically coupled when operating to the input lead (381), and an interposer lead (42) located generally between the input lead (381) and the output lead (382) and adapted when operating to be magnetically coupled thereto, said interposer lead (42) forming part of a closed loop circuit (47). According to a further embodiment, the device (39, 39', 40) further comprises, multiple pairs (19') of substantially parallel input leads (381) and output leads (382), wherein each pair (19') has an interposer lead (42) located between the input lead (381) and output lead (382) of such pair (19'). According to a still further embodiment, the device (39, 39', 40) further comprises a back-side conductor (221) underlying the semiconductor device (39, 39', 40), a portion of which back-side conductor (221) forms a part of the closed loop circuit (47) through which a current in the interposer lead (42) is adapted to flow. According to a yet further embodiment, wherein interconnections (451, 452) between the interposer lead (42) and the back-side conductor (221) are located generally outside an active area perimeter (70) of the semiconductor device (39, 39', 40).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. An electronic element, comprising:
   an amplifying device having an input with an input conductor and an output with an output conductor, wherein the input and output conductors are substantially parallel for a first distance and spaced apart by a second average distance; and
   an electrically conductive inductive interposer forming part of a closed loop circuit, wherein the inductive interposer is located between the output conductor and the input conductor.

2. The electronic element of claim 1, wherein a ratio R of the first distance divided by the second distance has a value $1 \leq R \leq 100$.

3. The electronic element of claim 2, wherein R has a value $4 \leq R \leq 60$.

4. The electronic element of claim 1, wherein the inductive interposer is DC electrically isolated from the output conductor and the input conductor.

5. The electronic element of claim 1, wherein the inductive interposer has end connections that are coupled by a further conductor of the closed circuit, and wherein the end connections are located substantially outside an active area perimeter of the electronic element.

6. The electronic element of claim 1, wherein the closed circuit containing the inductive interposer further comprises an impedance $Z_T$ that is frequency dependant.

7. The electronic element of claim 1, wherein the closed circuit containing the inductive interposer has a resistance less than or equal about one Ohm.

8. The electronic element of claim 1, wherein the input conductor, output conductor and inductive interposer lie substantially in the same plane.

9. The electronic element of claim 1, wherein the input conductor and the output conductor lie substantially in a first plane and the inductive interposer lies substantially in a second plane different than the first plane.

10. The electronic element of claim 1, wherein the amplifying device is a MOSFET.

11. The electronic element of claim 10, wherein the amplifying device is an LDMOS transistor.

12. A MOSFET device having a gate and a drain, comprising:
    one or more input lead coupled to the gate;
    one or more output lead coupled to the drain, wherein the one or more input lead and the one or more output lead have portions that are spaced apart by at least a first distance and substantially parallel along a second distance larger than the first distance; and
    an electrically conductive interposer lead adapted to be magnetically coupled when operating to the portions of the one or more input lead and the one or more output lead, the interposer lead forming part of a closed loop circuit.

13. The MOSFET device of claim 12, wherein when operating a voltage induced on the portion of the one or more input lead by a current flowing through the interposer lead opposes a voltage induced on the portion of the one or more input lead by another current flowing through the portion of the one or more output lead.

14. The MOSFET device of claim 12, wherein the interposer lead is located between the portion of the one or more input lead and the portion of the one or more output lead.

15. The MOSFET device of claim 12, wherein the MOSFET device is an LDMOS device.

16. The MOSFET device of claim 12, wherein the closed loop circuit has a resistance less than or equal about one Ohm.

17. A semiconductor device, comprising:
    an input lead;
    an output lead that runs substantially in the same general direction as the input lead for a first distance with an average separation less than the first distance and adapted when operating to be magnetically coupled to the input lead; and an interposer lead located generally between the input lead and the output lead and adapted when operating to be magnetically coupled thereto, said interposer lead forming part of a closed loop circuit.

18. The device of claim 17, further comprising, multiple pairs of substantially parallel input leads and output leads, wherein each pair has an interposer lead located between the input lead and output lead of such pair.

19. The semiconductor device of claim 17, further comprising a back-side conductor underlying the semiconductor device, a portion of which back-side conductor forms a part of the closed loop circuit through which a current in the interposer lead is adapted to flow.

20. The semiconductor device of claim 19, wherein interconnections between the interposer lead and the back-side conductor are located generally outside an active area perimeter of the semiconductor device.

* * * * *